United States Patent [19]

Temple

[11] Patent Number: 5,248,901
[45] Date of Patent: Sep. 28, 1993

[54] SEMICONDUCTOR DEVICES AND METHODS OF ASSEMBLY THEREOF

[75] Inventor: Victor A. K. Temple, Clifton Park, N.Y.

[73] Assignee: Harris Corporation, Melbourne, Fla.

[21] Appl. No.: 823,343

[22] Filed: Jan. 21, 1992

[51] Int. Cl.$^5$ .................................... H01L 39/02
[52] U.S. Cl. ................................. 257/678; 257/688; 257/690; 257/694; 257/698; 257/704; 257/730
[58] Field of Search .................. 357/72, 74, 81; 257/678, 688, 690, 694, 698, 704, 730

[56] References Cited

U.S. PATENT DOCUMENTS

| | | | |
|---|---|---|---|
| 3,486,083 | 12/1969 | Takada | 357/72 |
| 3,576,474 | 4/1971 | Huber | 357/81 |
| 5,028,987 | 7/1991 | Neugebauer et al. | 357/80 |

*Primary Examiner*—Eugene R. LaRoche
*Assistant Examiner*—Viet Q. Nguyen

[57] ABSTRACT

A semiconductor device package including a cup-like base having an encircling side wall having at its upper end, a laterally, outwardly extending metal flange. A lid for the package comprises a plate-like member having, at the lower, peripheral edge thereof, an outwardly laterally extending metal flange which overlaps and is bonded to the base flange in a solderless bond. In one embodiment of the invention, the lid has apertures therethrough which are sealed by metal foils bonded to the lower surface of the lid. The metal foils overlie and are bonded to electrodes on the upper surface of the chip within the package. In another embodiment of the invention, in which the lid also has apertures therethrough, a hollow tubing extends into each aperture in hermetic fit with the aperture wall. The chip within the package includes terminal leads extending into the tubings and hermetically bonded to the tubing inner walls.

12 Claims, 2 Drawing Sheets

SEMICONDUCTOR DEVICES AND METHODS OF ASSEMBLY THEREOF

BACKGROUND OF THE INVENTION

This invention relates to semiconductor devices and to the package thereof, and particularly to the assembly of the devices.

Although not limited thereto, this invention has particular utility with semiconductor devices of the type shown in U.S. Pat. No. 5,028,987, the subject matter of which is incorporated herein by reference. This patent discloses a package comprising a cup-like base including a side wall having a flat upper surface. On the inside bottom of the base is soldered a semiconductor chip having terminal leads attached to and extending upwardly from an upper surface of the chip. The package includes a flat lid which is soldered to the upper surface of the side wall of the base. The chip terminal leads extend through and beyond apertures through the lid and are soldered to the side walls of the apertures. The package hermetically encloses the chip.

One disadvantage of the foregoing described package is that, in the process of soldering the lid to the base, unwanted impurities released during the soldering process can become trapped within the package and damage the device.

SUMMARY OF THE INVENTION

A semiconductor device comprises a package including a cup-like base having a bottom wall and an encircling side wall which has, at its upper end, a laterally, outwardly extending metal flange. The flange extends entirely around the upper periphery of the base. A lid for the package comprises a plate-like member, e.g., of ceramic, having, at the lower, peripheral edge thereof, an outwardly laterally extending metal flange which overlaps the base flange. Because both flanges extend outwardly from the package, the flanges can be readily sandwiched between bonding tools, e.g., resistance welding electrodes, for bonding together the flanges in a solderless bond during the fabrication of the package.

In one embodiment of the invention, the lid has apertures therethrough which are sealed by metal foils bonded to the lower surface of the lid. In the completed package, the metal foils overlie and are bonded to electrodes on the upper surface of the chip within the package. In the bonding of the foils to the electrodes, the upper surface of the lid is pressed downwardly to provide a pressure contact of the foils against the electrodes. Flexure of the package, without damage thereto, is provided by the flexibility of the laterally extending flanges.

In another embodiment of the invention, in which the lid also has apertures therethrough, a hollow tubing extends into each aperture in hermetic fit with the aperture wall. The chip within the package includes terminal leads extending into the tubings and hermetically bonded to the tubing inner walls.

Also disclosed is a novel arrangement for providing stress relief at the bond of a terminal lead to a semiconductor substrate surface.

DESCRIPTION OF PREFERRED EMBODIMENTS

Figure 1:
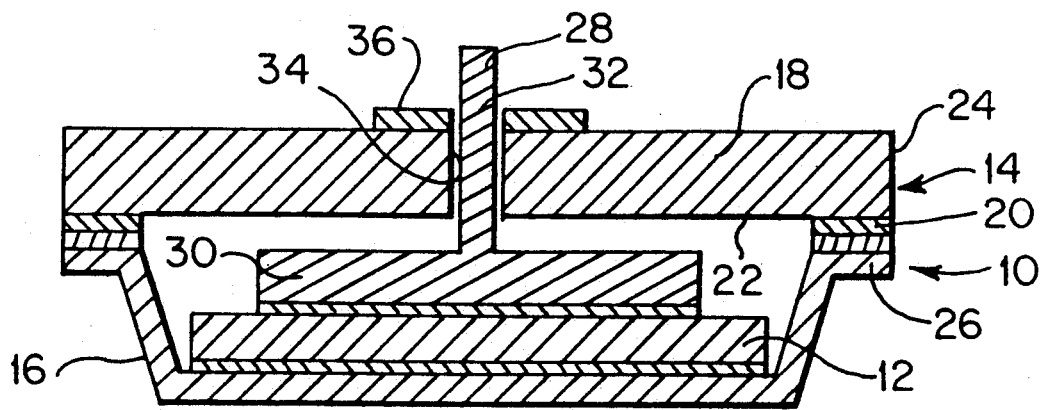
FIG. 1 is a cross-sectional view of a prior art semiconductor device generally similar to the device shown in the aforementioned U.S. Pat. No. 5,028,987.

FIG. 1 shows an example of a prior art semiconductor device 10 comprising a semiconductor chip 12 hermetically sealed within a package 14 comprising a metal cup-like base 16, e.g., of copper, and a plate-like lid 18 of ceramic, e.g., of alumina. A thin foil 20 of copper is bonded to the inside surface 22 of the lid along the outside edge 24 thereof, and the lid is bonded to the base by means of a soldered joint between the lid foil 20 and a laterally extending flange 26 extending around the base 16. Terminal leads 28 for the device are of generally L-shape including a horizontal portion 30 bonded to a surface region of the chip 12 and a vertical portion 32 extending through an aperture 34 through the ceramic lid 18. The lead vertical portions 32 are hermetically sealed to the lid by means of metal layers, e.g., copper foils 36 pre-bonded to the lid around the apertures 34, the metal layers being soldered to the lead portions 32.

As previously noted, one problem with this known type of device is that during the soldering of the lid 18 to the base 16, unwanted impurities generated by the soldering process can become trapped within the package. The trapped impurities can damage the device.

Figure 2:
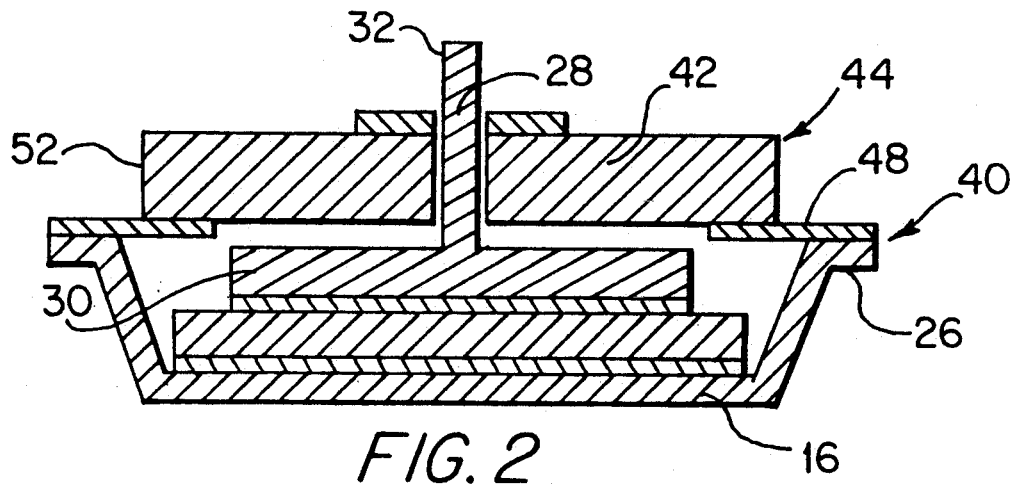
FIG. 2 is a cross-sectional view of a semiconductor device in accordance with this invention.
Figure 3:
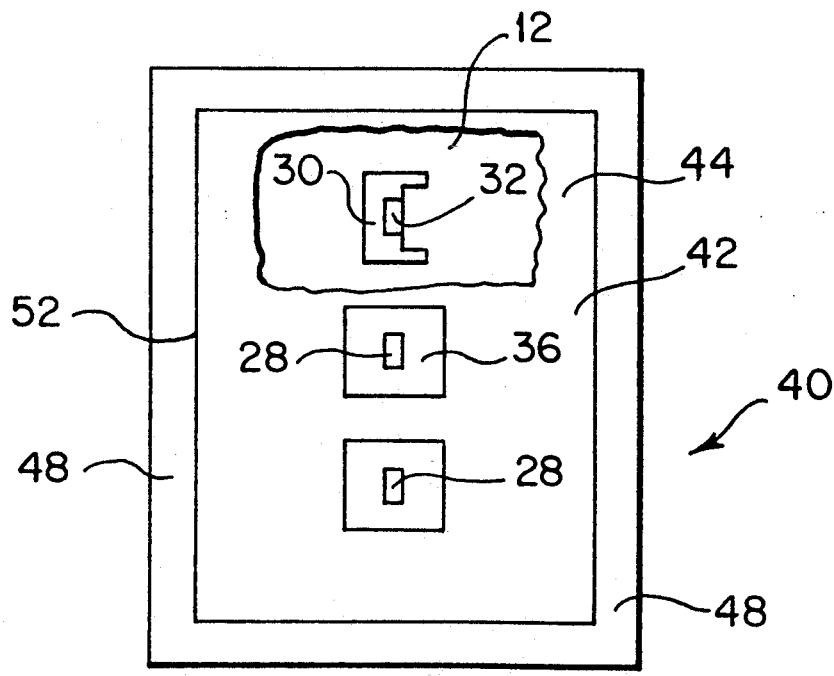
FIG. 3 is a plan view of the device shown in FIG. 2, but with a portion of the lid broken away to show one of the terminal leads bonded to an electrode on the substrate surface.

FIGS. 2 and 3 show a device 40 according to this invention which largely avoids the problem of trapped solder-generated impurities. The device 40 is generally similar to the device 10 except that the ceramic portion 42 of the lid 44 of the device 40 does not overlap the base flange 26. Rather, a copper foil 48 bonded to the ceramic portion 42 extends beyond an edge 52 thereof and overlaps the base flange 26.

The external surfaces of the overlapped flanges 26 and 48 are fully accessible to welding tools, hence the flanges can be readily bonded together in a "welded" type, solderless bond. By "welded" type bond is meant ultrasonic, thermal compression, thermosonic and diffusion bonding; cold, resistance, laser, and spot welding; direct bond copper; and other similar bonding processes including electron beam welding, electric arc welding and gas torch welding. Several of these bonding processes require careful thermal isolation of the weld area and use of an inert gas or vacuum environment. Resistance and spot welding require an interface material, such as a nickleiron alloy, between the copper foils with a relatively high electrical resistance. The presently preferred bonding process is thermal compression, which readily bonds clean copper to clean copper. Laser and ultrasonic bonding both appear particularly promising also.

Because the lid 44 of the device 40 is solderless bonded to the base 16, the trapped solder impurity problem of the prior art devices is largely overcome. Other bonds of the device can be solder bonded provided the solder bonds are made before the package is hermetically sealed.

Figure 4:
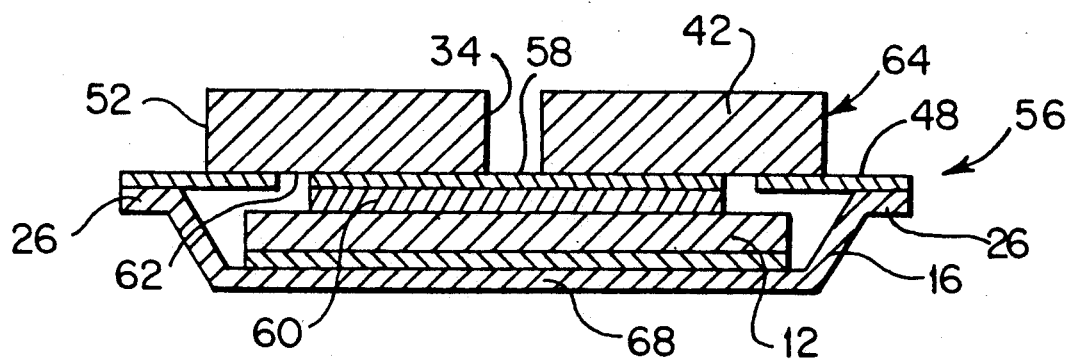
FIGS. 4 and 5 are cross-sectional views of two other embodiments of the invention.

Another embodiment of the invention making use of overlapped and extending package flanges is shown in FIG. 4.

In these figures, a device 56 is shown generally similar to the device 40 shown in FIGS. 2 and 3. However, in place of the vertically extending terminal leads 28 of the device 40, metal foils 58, e.g., of copper, are provided directly bonded to conductive surface areas 60 of the semiconductor chip or substrate 12. The metal foils 58 are bonded to the bottom or interior surface 62 of the ceramic portion 42 of the lid 64, and underlie and hermetically seal the apertures through the lid 62. The bonding of the foils 58 to the substrate surface areas 60 is preferably, but not necessarily, by a solderless bond, e.g., by diffusion bonding, thermal compression bonding, gold-aluminum reaction bonding, or the like. For the gold-aluminum reaction bonding, a thin layer of gold is provided on the bottom of the copper foils 58, and the conductive surface areas (electrodes) 60 of the substrate are either layers of aluminum or a layer of some other conductive material, e.g., doped polycrystalline silicon, covered with a thin layer of aluminum.

In the assembly of the device 56, in accordance with one embodiment of the invention, a semiconductor substrate 12 is solder bonded to the bottom wall 68 of the base 16, and, after cleanup of the solder residue, the lid 64, having the various foils 48 and 58 pre-bonded thereto, is placed over the base with each foil 58 aligned with a corresponding substrate electrode 60 and the extending lid flange 48 overlapped with the base flange 26. Then, the peripheral flanges 26 and 48 of the base and lid, respectively, are bonded together and the lid foils 58 are bonded to the substrate electrodes 60. Preferably, the same bonding process, e.g., aluminum-gold reaction or diffusion bonding, is used for all the bonds to be formed, and all the bonds (including, if desired, a solderless bonding of the substrate 12 to the base 16) are formed simultaneously.

As shown in FIG. 4, the edge 52 of the lid ceramic portion 42 is spaced laterally inwardly from the base flange 26, and, owing to the flexibility of the thin lid foil 48 (e.g., 0.1 mm thick and having an extending length beyond the edge 52 of 1.0 mm), relative movement between the lid 64 and the base 16 is possible. This provides a significant manufacturing advantage because, during the bonding process, the package can flex as necessary to allow proper contacting of the various surfaces to be bonded without danger of breaking the package. Also, by relying on flexure of the package to provide proper surface contacting, the device parts can be manufactured with larger dimensional tolerances.

During the aforementioned bonding of the lid 64 to the base 16 and the simultaneous bonding of the lid foils 58 to the substrate electrodes 60, the substrate is tightly clamped between the lid and the base. Thus, in the bonding process, the application of bonding pressures against the top and bottom surfaces of the package does not damage the device 56.

After completion of the package of the device 56, terminal leads (not shown) can be inserted into the lid apertures 34 and bonded to the exposed surfaces of the foils 58 underlying the apertures. Bonding pressures can be applied because the foil bottom surfaces are directly bonded to the substrate surface. Also, because the package is hermetically sealed, the terminal leads can be solder bonded to the foils without danger of contamination of the package interior.

Alternatively, no terminal leads are added to the device, but rather, in use, the device 56 is mounted on a circuit board having projecting leads which extend into the device apertures and into contact with the underlying foils.

A further advantage of the device 56 is that because the substrate 12 is tightly sandwiched and bonded between the base bottom wall 68 and the lid 64, two paths for conduction of heat from the device are provided. One path is through the bottom of the base 16, as is normal, and the other path is through the lid 64, which is not common in devices of the type shown. To take advantage of both heat conduction paths, if desired, the device 56, in use, is tightly sandwiched between upper and lower heat sinks.

Figure 5:
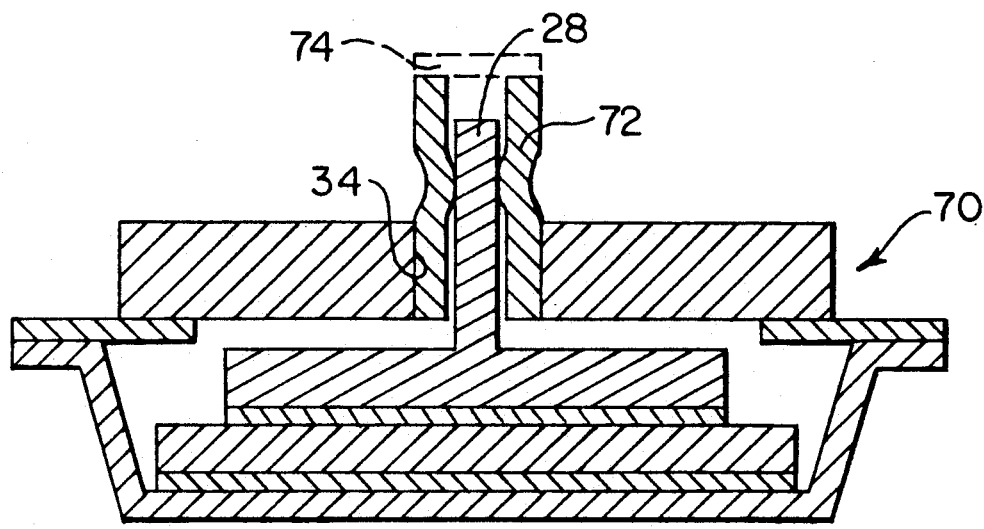

FIG. 5 shows a device 70 similar to the device 40 shown in FIGS. 2 and 3 but including a hollow tubing 72 (only one shown), e.g., of copper, bonded to the inner wall of each of the apertures 34. The various terminal leads 28 of the device 70 extend through the tubings 72, and each lead is bonded to the inside walls of its respective tubing. The leads preferably rather snugly within the tubings and can be readily bonded thereto by squeezing the tubing walls against the leads and welding them together. The leads can also be soldered to the tubing walls. The solder can be prevented from wicking into the package by the tight fit between the tubings and the leads and by pre-oxidizing surface portions of the leads between the solder joints and the bottom edges of the apertures. As known, solder generally does not wet oxide surfaces. In one embodiment for example, the terminal leads are copper, and the solder comprises 90 percent lead and 10 percent tin.

Also, as shown by dashed lines in FIG. 5, the tubings 70 can have closed upper ends 74.

Figure 6:
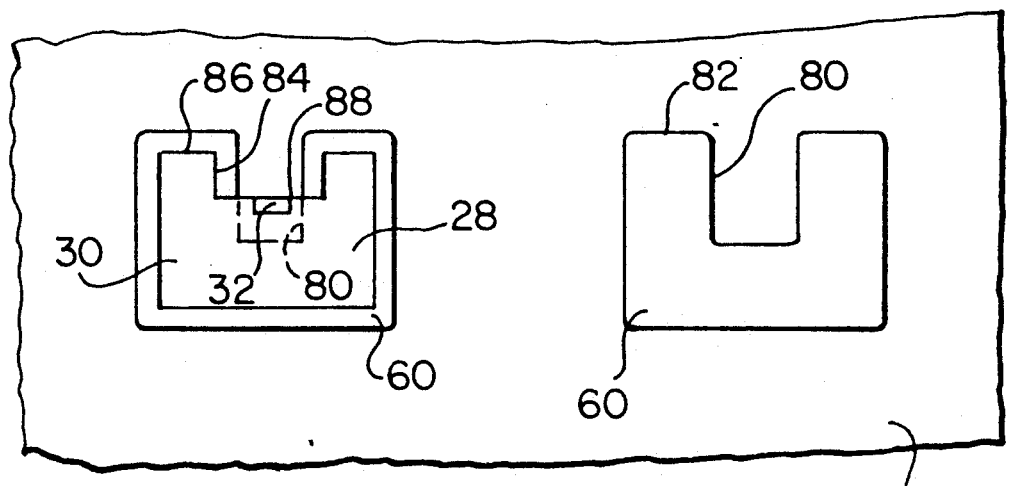
FIGS. 6 is an enlarged view of a portion of a substrate surface similar to that exposed through the lid in FIG. 1, but showing two substrate electrodes.

FIG. 6 shows a plan view of a semiconductor substrate 12 having a terminal lead 28 bonded to a conductive surface area (electrode) 60 of the substrate. An adjacent surface area 60 is also shown, but the lead normally bonded thereto is not shown for better illustration.

The conductive areas 60 on the substrate 12 are of generally rectangular shape, but include a slot 80 in one edge 82 thereof. The conductive areas 60 are of a material wettable by solder, e.g., nickel. The slots 80 overlie and expose a surface portion of the substrate 12 which is not wettable by solder e.g., silicon dioxide. The solder can comprise, for example, 90 percent lead and 10 percent tin.

The terminal lead 28 comprises a base portion 30 and a vertical portion 32 (see, also, FIG. 2). The base portion 30 is solder bonded to the conductive area 60 and, to this end, the shape of the base portion 30 corresponds generally to that of the conductive area 60, including a slot 84 in one edge 86 thereof. The vertical portion 32 of the terminal lead is connected to the base portion 30 at the bottom edge 88 of the slot 84.

The terminal lead base portion 30 fits within the periphery of underlying conductive area 60 except that the slot 80 in the area 60 is deeper than the slot 84 in the base portion 30. Thus, the entire bottom edge 88 of the slot 84 in the base portion 30 does not directly overlie the conductive area 60, but a portion thereof overlies the underlying silicon dioxide surface exposed through the slot 80. Because the solder does not wet silicon dioxide, an area of the base portion, including the area of attachment of the vertical portion 32 to the base portion, is not bonded to the substrate surface. This provides greater flexibility between the vertical and base portions of the terminal leads, and reduces the likelihood of rupture of the lead-substrate bond during mounting of the device on a circuit board. The selective bonding feature of the terminal leads provides strain relief comparable to the bend in the terminal leads shown in FIG. 4 of the aforementioned U.S. Pat. No. 5,028,987.

What is claimed is:

1. A semiconductor device comprising a package and a semiconductor substrate within the interior of said package, the package comprising a cup-like base having a bottom wall and a side wall, the upper end of said wall terminating in a metal flange extending laterally outwardly from said wall and entirely around the periphery of said base, and a lid comprising a plate-like member of ceramic and a metal foil bonded to an edge of said member and extending laterally outwardly therefrom and completely around the periphery of said member, said metal foil overlapping said flange, and said foil and said flange being solderless bonded together for hermetically sealing said lid to said base.

2. A device according to claim 1 wherein said plate-like member has a passageway therethrough having an opening in an interior surface of said member, and including a metal foil bonded to said interior surface extending across and sealing said opening.

3. A device according to claim 2 including a terminal lead extending from outside said package into said passageway and electrically connected to said foil across the opening thereof.

4. A device according to claim 1 wherein said plate-like member has a passageway therethrough opening within said package, a hollow tubing extending into said passageway, the outside surface of the wall of said tubing being bonded to the wall of said passageway, a length of said tubing extending outwardly from said lid, and a terminal lead connected to a surface area of said substrate extending into said tubing and bonded to the wall of said tubing.

5. A semiconductor device comprising a semiconductor substrate having a surface, an electrically conductive area of a material wettable by a solder which does not wet said surface disposed on said surface, and a terminal lead including a base portion solder bonded to said conductive area except for a segment thereof extending beyond an edge of said conductive area and overlying said surface, said terminal lead including a vertical portion connected to said base portion at said segment thereof.

6. A device according to claim 1 wherein said plate-like member has a surface within the interior of said package joined to a side surface of said plate-like member, said metal foil being bonded to said interior surface and having a portion extending parallel to said interior surface and outwardly beyond said side surface, said outwardly extending portion of said foil being bonded to said flange.

7. A device according to claim 6 wherein said foil and said flange are welded together.

8. A device according to claim 4 wherein said terminal lead is welded to the wall of said tubing.

9. A device according to claim 8 wherein said extending length of said tubing terminates in an hermetically sealed end, and said lead terminates within said tubing.

10. A device according to claim 5 including a package enclosing said substrate, said vertical portion of said lead extending from said base portion through a wall of said package.

11. A semiconductor device comprising a package and a semiconductor substrate within the interior of said package, the package comprising a cup-like base having a bottom wall and a side wall, and a lid comprising a plate-like member of ceramic bonded to the side wall of said base, said plate-like member having a passageway therethrough having an opening in an interior surface of said member, and including a metal foil bonded to said interior surface extending across and sealing said passageway opening.

12. A device according to claim 11 including a terminal lead extending from outside said package into said passageway and electrically connected to said foil across the opening thereof.

* * * * *